United States Patent [19]

Yamazaki

[11] Patent Number: 4,937,129
[45] Date of Patent: Jun. 26, 1990

[54] THIN FILM PATTERN STRUCTURE FORMED ON A GLASS SUBSTRATE

[75] Inventor: Shunpei Yamazaki, Tokyo, Japan

[73] Assignee: Semiconductor Energy Laboratory Co., Ltd., Kanagawa, Japan

[21] Appl. No.: 293,121

[22] Filed: Jan. 3, 1989

[30] Foreign Application Priority Data

Jan. 6, 1988 [JP] Japan .................. 63-1576
Jan. 6, 1988 [JP] Japan .................. 63-1577
Jan. 6, 1988 [JP] Japan .................. 63-1578

[51] Int. Cl.⁵ ............................................. B32B 9/00
[52] U.S. Cl. ................................ 428/195; 428/426; 428/428; 428/432; 428/457; 428/1; 430/311; 430/945
[58] Field of Search ............... 428/195, 426, 428, 457, 428/432, 1; 430/311, 945

[56] References Cited

U.S. PATENT DOCUMENTS 4,595,791 6/1986 Basol et al. ..................... 437/5
4,687,940 8/1987 Ward et al. ................ 250/492.2
4,842,629 6/1989 Clemenu et al. ............. 156/655

*Primary Examiner*—Patrick Ryan
*Attorney, Agent, or Firm*—Sixbey, Friedman, Leedom & Ferguson

[57] ABSTRACT

A conductive pattern is formed, by laser scribing, on a soda-lime glass substrate suitable for liquid crystal devices. Besides a first ion blocking film interposed between the glass substrate and the conductive pattern, a second ion blocking film is provided on the structure in order to inhibit sodium ions drift from the substrate during the laser scribing through the pattern formed in the first ion blocking film and the conductive film constituting the pattern.

15 Claims, 3 Drawing Sheets

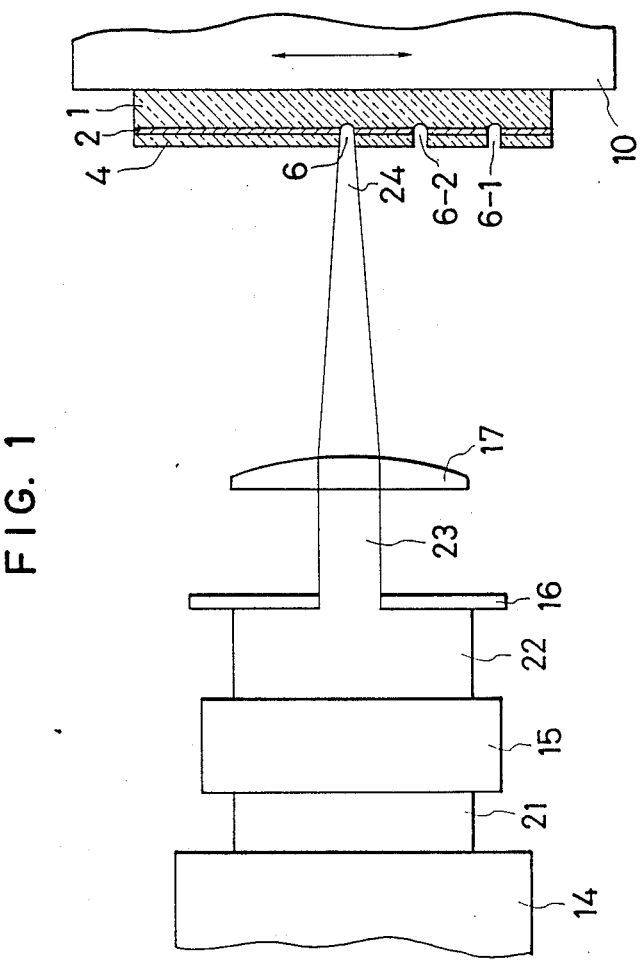

THIN FILM PATTERN STRUCTURE FORMED ON A GLASS SUBSTRATE

BACKGROUND OF THE INVENTION

The present invention relates to a thin film pattern structure and more particularly, though not exclusively, relates to a thin film pattern fabricated on a glass substrate by laser scribing.

Photolithography is a well-known technique for producing patterns in thin films formed on substrates. This technique is convenient and advantageous, having regard to the desirability of removing portions of the thin film to be processed without causing damage to the underlying surface. However, a somewhat large number of steps is necessary for completing patterning procedure in accordance with this method. Namely, after forming the thin film to be treated on a substrate, a photoresist film is formed and patterned; the thin film is subjected to an etchant through the patterned photoresist film as a mask and then the photoresist film is removed.

Laser scribing techniques are well known in the art as a low cost patterning method capable of carrying out the scribing at a high speed. YAG laser (IR light, 1.06 microns) is a representative laser which has been generally used for this purpose. Since the optical energy of this laser is only 1.23 eV, however, tin oxide, indium oxide (or ITO), ZnO or so forth having optical energy gaps of about 3 to 4 eV are not effectively processed by the YAG laser. While transparent conductive oxide (CTO) films are generally made of this class.

The applicant has proposed the use of eximer lasers in order to emit pulsed laser beams for performing the laser scribing of transparent conductive films. The wavelength of the laser beams is not wider than 400 nm equivalent to photon energies higher than 3.1 eV. This laser scribing method, however, has a shortcoming. When portions of a transparent conductive film formed over a sodium glass substrate with an ion blocking film therebetween is removed in order to produce electrode patterns thereon, the ion blocking film and the glass substrate are partially eliminated together, and therefore the surface of the glass substrate is exposed. Eventually, in case of liquid crystal device manufacture, the liquid crystal material contained in the device is contaminated by sodium ions introduced from the glass substrate. Furthermore, the scribing makes the upper surface thereof uneven as well as residue remaining on the edges of the removal portions, the residue is piled as high as 0.5 to 1 micron. The unevenness is undesirable not only in regard to the application to liquid crystal devices but also to the manufacture of general electric devices including laminating process. The uneven surface might may be the cause of electrical shorting between different levels of the laminate and disconnection of the electrical patterns superimposed thereon.

SUMMARY OF THE INVENTION

It is an object of the present invention to provide a thin film pattern formed on a glass substrate in order that little contaminant is leaked from the substrate.

In accordance with a preferred embodiment, a pattern is etched by use of a pulsed laser beam whose wavelength is not longer than 400 nm, followed by coating the etched portions with an ion blocking film.

BRIEF DESCRIPTION OF THE DRAWINGS

FIG. 1 is a schematic diagram showing a laser scribing assembly for laser patterning in accordance with the present invention.

DETAILED DESCRIPTION OF THE PREFERRED EMBODIMENTS

Figure 2A:
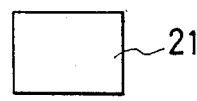
FIGS. 2(A) to 2(D) are explanatory views showing the shaping process of a laser beam in cross section in accordance with the present invention.

Referring now to FIG. 1, a laser scribing assembly is shown in accordance with the present invention. The laser assembly is comprised of a KrF eximer laser 14 (wavelength=248 nm, Eg=5.0 eV, efficient=3%, output energy=350 mJ), a beam expander 15, a mask 16, a convex cylindrical lens 17 made of synthetic quartz and a substrate holder 10. The substrate holder 10 is adapted to move in the vertical direction as viewed in the illustration in order to change the position of a soda-lime glass substrate 1 mounted thereon. Formed on the substrate 1 are an ion blocking film 2 of 100 to 1500 Å, e.g. 200 Å thickness made of silicon oxide containing very little amounts of phosphorus, sodium and boron, and a transparent conductive film of 1000 to 3000 Å thickness made of ITO, tin oxide, zinc oxide or a laminate thereof, the transparent conductive film 4 may be provided with a chromium or molibdenum thin film coating. Depending on the case, an insulating or semiconductor film may be formed under or over the conductive film if necessary.

Figure 2B:
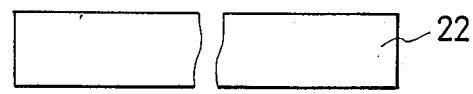
Figure 2C:
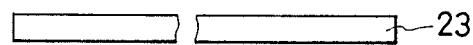
Figure 2D:

The height and width of the laser beam 21 just after emission from the eximer laser 14 are 16 mm and 20 mm as illustrated in FIG. 2(A). This laser beam 21 is expanded to have a width of 300 mm as illustrated in FIG. 2(B), while its height is maintained, by means of the beam expander. After expansion, the energy density becomes $5.6 \times 10^{-2}$ mJ/mm$^2$. The expanded beam 22 is then deprived of its periphery by means of the mask 16 in order to have a height of 2 mm as illustrated in FIG. 2(C). The removal of the peripheral portion of the expanded laser beam is carried out for the purpose of reducing the aberation effect by the subsequent lens 17. The flat laser beam 13 is contracted and focussed on the surface of the substrate 1 by means of the lens 17 as illustrated in FIG. 1 and FIG. 2(D). The height of the laser beam at the surface of the substrate 1 is 10 microns. In practice, the grooves to be formed on the substrate may have widths ranging from 2 microns to 200 microns, e.g. 50 microns, 20 microns, 10 microns, 5 microns and 3 microns, depending upon the applications.

Figure 3A:
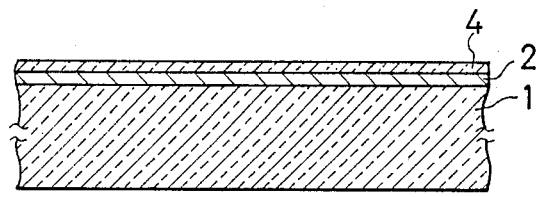
FIGS. 3(A) to 3(D) are cross sectional views showing the fabricating process of a thin film pattern in accordance with the present invention.
Figure 3B:
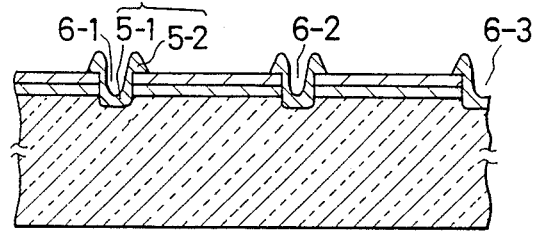
Figure 3C:
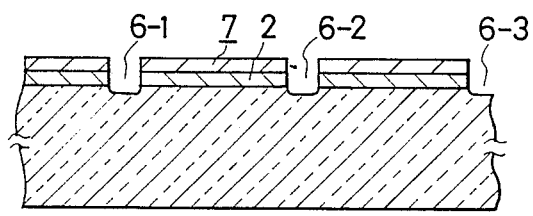
Figure 3D:
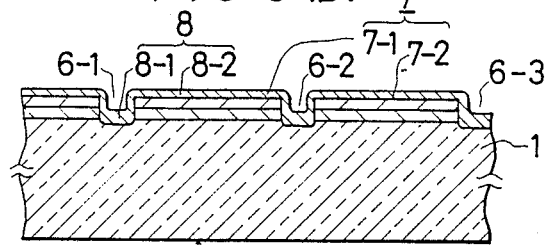

The laser beam is repeatedly projected on the substrate 1 in the form of pulses. The pulse duration is 20 namo seconds and the frequency is 1-100 Hz, for example 10 Hz. Then, grooves 6-1, 6-2, ... are formed as illustrated in FIG. 3(B). The distance between adjacent ones of the grooves is 2 microns. Residue 5 is left around and inside of the grooves as illustrated in FIG. 3(B). The residue is selectively removed by an acid, for example, a hydrofluoric acid (diluted by water at 1/10) or a fluoride solution mixture such as an acidic ammonia fluoride, followed by ultrasonic cleaning with acetone and pure water as illustrated in FIG. 3(C). In this structure, however, upper portions of the glass substrate (0.3-1.0 micron depth) just under the grooves are also removed and eventually the surface of the glass substrate is exposed through the grooves.

If the structure as shown in FIG. 3(C) is used in manufacture of liquid crystal devices, liquid crystal material, of which high purity is required, is contaminated by sodium ions entered from the soda-lime substrate when subjected to long time use. Also, if it is used as the substrate for image sensors, solar cells and the like, amorphous semiconductor films are contaminated by sodium ions, resulting in the degradation of photoelectric conversion ability and the modification of the semiconductor to n-type semiconductor.

In order to avoid the undesirable contamination by sodium ions, a second ion blocking film 8 is formed on the substrate 1 over the grooves. The formation of the second blocking film is carried out by coating an organic resin such as polyimide or inorganic resin such as silicon oxide. Preferably, they are first coated on the substrate in precursor fluid form (non-polymer state or organic silicon liquid compound such as silazanes). A spinner may be used for the coating. Alternatively, screen press printing technique, spraying technique or other coating methods may be used instead. The thickness of the precursor film is 50-2500 Å. For example, the thickness is 300 Å on the conductive film and 500 Å in the grooves. The precursor film is thermally cured. For example, in case of a polyimide solution, the film is heated at 230° C. for two hours. In case of an organic silicon liquid compound, the film is transformed into a blocking film made of solid state silicon oxide by thermal annealing. It is noted that, in accordance with the above mentioned coating methods, the thickness of the second blocking film in the groove is greater than that on the transparent conductive film 4. For instance, when the second blocking film is formed to a thickness of 50-300 Å on the conductive film, the thickness on the bottom of the grooves becomes 100-600 Å. Because of this thickness, ion drift through the second blocking film is effectively prevented. Ideally, it is desired to completely fill the grooves to make the upper surface flat. In this regard, the use of liquid precursors is preferred. Particularly, in order to fill narrow grooves, large surface tension is advantageous.

The second blocking film made of organic material may be used as an orientation control film when a liquid crystal display is constructed with this. Rubbing treatment is given to the surface of the film. In accordance with experiments, the contrast of the displayed image was measured to be 20 and little degraded even after the use for 1000 hours at 50° C. Current leakage was examined by applying a direct voltage of 50 V across each groove. This examination was carried out across 100 grooves and having 30 cm length and 10 microns width. As a result, all the leakage currents were within the range of $1\times10^{-9}$ A to $2\times10^{-9}$ A.

While several embodiments have been specifically described, it is to be appreciated that the present invention is not limited to the particular examples described and that modifications and variations can be made without departure from the scope of the invention as defined by the append claims. Examples are as follow.

Insulating films constituting a color filter may be integrally formed under or over the transparent conductive film.

Although the conductive film is made of a transparent conductive material such as ITO, $SiO_2$ or ZnO film, a thin film of a metal such as cromium or molibdenum can be used in the same manner.

An image sensor can be constructed by superimposing an amorphous silicon semiconductor film on the transparent conductive film and covering the semiconductor film by an opposed electrode arrangement.

Although in accordance with the preferred embodiment, the grooves are narrow as compared with the remaining transparent conductive film, narrow strips of 20 microns width may be left between removed portion of 400 microns width by making use of a train of pulses which are projected sequentially while the substrate is gradually moved a little.

I claim:

1. A film pattern structure comprising:
   a glass substrate;
   a first ion blocking film formed on said substrate;
   a conductive film formed on said first ion blocking film,
   portions of said first ion blocking film and said conductive film being integrally removed throughout the thickness in accordance with a prescribed pattern; and
   a second ion blocking film formed on the surface portions of said glass substrate that are deprived of said first ion blocking film and said conductive film and exposed through the said pattern formed in said first ion blocking film and said conductive film.

2. The structure of claim 1 wherein said glass substrate is made of a soda-lime glass.

3. The structure of claim 2 wherein said second ion blocking film is made of polyimide.

4. The structure of claim 2 wherein said second ion blocking film is made of silicon oxide.

5. The structure of claim 2 wherein said conductive film is made of a conductive transparent material.

6. The structure of claim 5 wherein said conductive transparent material is tin oxide, indium oxide, zinc oxide or ITO.

7. The structure of claim 1 wherein the thickness of said second ion blocking film on said conductive film is less than that on said substrate surface.

8. A method of producing a pattern in a thin film formed on a glass substrate comprising the steps of:
   forming a first ion blocking film on said substrate;
   forming a conductive film on said first ion blocking film;
   removing said first ion blocking film and said conductive film in accordance with a prescribed pattern in order that the corresponding surface portions of said substrate are exposed therethrough; and
   forming a second blocking film on said first ion blocking film over the exposed surface portions of said substrate.

9. The method of claim 8 wherein said removing step is carried out by laser scribing.

10. The method of claim 9 wherein said laser scribing is carried out with an eximer laser.

11. The method of claim 10 wherein the wavelength of laser rays used for said laser scribing is not longer than 400 nm.

12. The method of claim 9 further comprising a step of removing the residue remaining after the removal of said first ion blocking film and said conductive film.

13. The method of claim 12 wherein said residue removal step is carried out by use of hydrofluoric acid.

14. The method of claim 8 wherein said second ion blocking film step comprises applying a liquid precursor, and thermal annealing the liquid precursor.

15. The method of claim 8, wherein the step of removing said first ion blocking film and said conductive film in accordance with a prescribed pattern includes removing said first film and said conductive film in patterns suitable for liquid crystal devices.

* * * * *